(12) United States Patent
Tyler et al.

(10) Patent No.: US 6,704,180 B2
(45) Date of Patent: Mar. 9, 2004

(54) LOW INPUT CAPACITANCE ELECTROSTATIC DISCHARGE PROTECTION CIRCUIT UTILIZING FEEDBACK

(75) Inventors: Larry E. Tyler, Mesa, AZ (US); James T. May, Tempe, AZ (US)

(73) Assignee: Medtronic, Inc., Minneapolis, MN (US)

( * ) Notice: Subject to any disclaimer, the term of this patent is extended or adjusted under 35 U.S.C. 154(b) by 146 days.

(21) Appl. No.: 10/132,756

(22) Filed: Apr. 25, 2002

(65) Prior Publication Data

US 2003/0202300 A1 Oct. 30, 2003

(51) Int. Cl.$^7$ ................................................ H02H 9/04
(52) U.S. Cl. ........................................................ 361/56
(58) Field of Search ............................... 361/56; 330/253

(56) References Cited

U.S. PATENT DOCUMENTS

| | | |
|---|---|---|
| 5,287,241 A | 2/1994 | Puar |
| 5,473,500 A | 12/1995 | Payne et al. |
| 5,493,142 A | 2/1996 | Randazzo et al. |
| 5,512,853 A | 4/1996 | Ueno et al. |
| 5,530,612 A | 6/1996 | Maloney |
| 5,535,086 A | 7/1996 | Mentzer |
| 5,556,420 A | 9/1996 | Mortazavi et al. |
| 5,610,790 A | 3/1997 | Staab et al. |
| 5,610,791 A | 3/1997 | Voldman |
| 5,617,283 A | 4/1997 | Krakauer et al. |
| 5,637,892 A | 6/1997 | Leach |
| 5,654,574 A | 8/1997 | Williams et al. |
| 5,719,427 A | 2/1998 | Tong et al. |
| 5,721,656 A | 2/1998 | Wu et al. |
| 5,946,176 A | 8/1999 | Ghoshal |
| 5,947,177 A | 9/1999 | Kratzer |

*Primary Examiner*—Brian Sircus
*Assistant Examiner*—Boris Benenson
(74) *Attorney, Agent, or Firm*—Girma Wolde-Michael

(57) ABSTRACT

An ESD protection circuit protects circuitry internal to an integrated circuit from ESD damage to electrostatic discharge voltages occurring at one or more of the inputs of the integrated circuit while maintaining substantially zero effective capacitance at the inputs. The ESD protection circuit includes a pair of diodes of opposite conductivity coupled between at least one of the inputs of the integrated circuit and an internal node thereof for providing current paths to the operating supply rails when ESD voltages occurring at the input forward bias the diodes. A unity gain amplifier provides feedback between the input and the internal circuit node to maintain a zero voltage difference therebetween whereby the effective capacitance seen at the input is reduced to substantially zero.

41 Claims, 2 Drawing Sheets

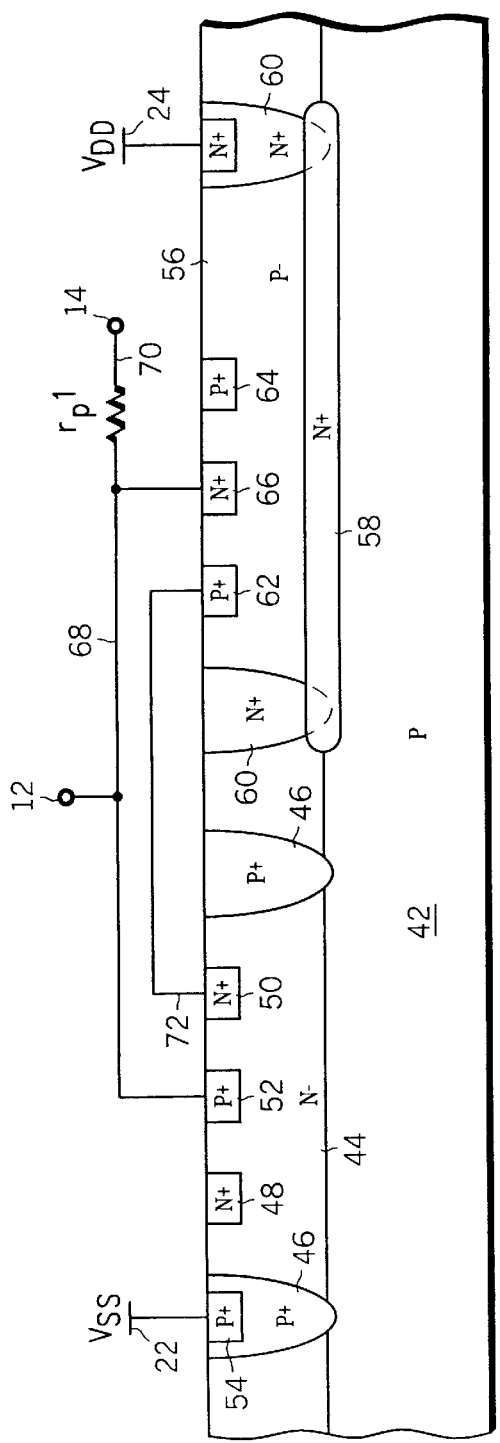

LOW INPUT CAPACITANCE ELECTROSTATIC DISCHARGE PROTECTION CIRCUIT UTILIZING FEEDBACK

FIELD OF THE INVENTION

This invention relates generally to electrostatic discharge (ESD) circuits and, more particularly, to an ESD protection circuit and method for use with integrated circuits having input pads without significantly increasing the parasitic capacitance at the input pads.

BACKGROUND OF THE INVENTION

Integrated circuits (IC) normally require ESD protection. ESD protection is conventionally provided at bond pads and/or input/output pads of the IC. In this manner ESD protection is provided to internal circuitry of the IC, such as transistors etc., from ESD spike voltages that exceed the rating of the active devices of the IC. Typically, electrostatic discharge voltage spikes occur at the input pads during handling of the IC.

The prior art is replete with myriad of ESD integrated protection circuits. Typical ESD protection circuits divert ESD generated voltages occurring at input pads to the power rails of the IC circuits employing such protection. The input pads, for example, are clamped to approximately $V_{DD}$ or $V_{SS}$ (the operating voltages applied to the IC) by using ESD protection diodes depending on the polarity of the ESD voltages. Thus, for instance, in response to an ESD voltage established at an input pad of a first polarity (positive) exceeding the forward breakdown voltage of one of the ESD protection diode, current flow is oriented from the pad via the ESD protection diode to the high potential power rail ($V_{DD}$). Likewise, if the ESD voltage established at the input pad is of a second polarity and exceeds the forward breakdown voltage of the second ESD protection diode, current flow is oriented from ground ($V_{SS}$) via the second ESD protection diode to the pad. Hence, both positive and negative ESD occurrences are clamped to the power rails by the aforementioned action of the ESDP diodes. Similarly, the output pads are also protected from ESD spike voltages by a like pair of diodes.

Most, if not all, conventional ESD protection circuits typically produce significantly large input capacitance at the input/output pads of the integrated circuit. The increased capacitance is due to the relatively large conductive elements such as the metal pads or conductive patterns associated with the integrated circuit as well as resistors, and the base-emitter junctions of the ESDP diodes of the protection circuit. In some applications, this increased capacitance at the input pads of the integrated ESD protection circuit cannot be tolerated. For example, the integrated circuit employing a conventional ESD protection may be used to probe the output of a pressure sensor. Typically, such pressure sensors provide a small delta output voltage. In order to detect the output of the sensor, the capacitance at the input of the probing device must be as small of value as possible.

Hence, a need exists to provide an integrated ESD protection circuit in which the capacitance thereof is reduced to a minimum value.

SUMMARY OF THE INVENTION

In accordance with an aspect of the present invention, there is provided an electrostatic discharge (ESD) protection circuit for protecting circuitry internal to an integrated circuit from ESD damage due to ESD voltage that may occur at the input of the integrated circuit while minimizing any effective input capacitance appearing at the input. The ESD protection circuit includes at least one pair of opposite conductivity type diodes coupled between the input and an internal circuit node which provide current paths between the input and the power rails of the integrated when forward bias by ESD voltages. A unity gain amplifier provides feedback to maintain a zero voltage difference between the input and the internal circuit node thereby reducing the effective capacitance to substantially zero.

BRIEF DESCRIPTION OF THE DRAWINGS

FIG. 3 is a simplified cross sectional view (not to scale) of portion of an integrated circuit illustrating a portion of the circuit shown in FIG. 1; and FIG. 4 is a schematic diagram of another embodiment of the present invention.

DESCRIPTION OF THE PREFERRED EMBODIMENT

Figure 1:
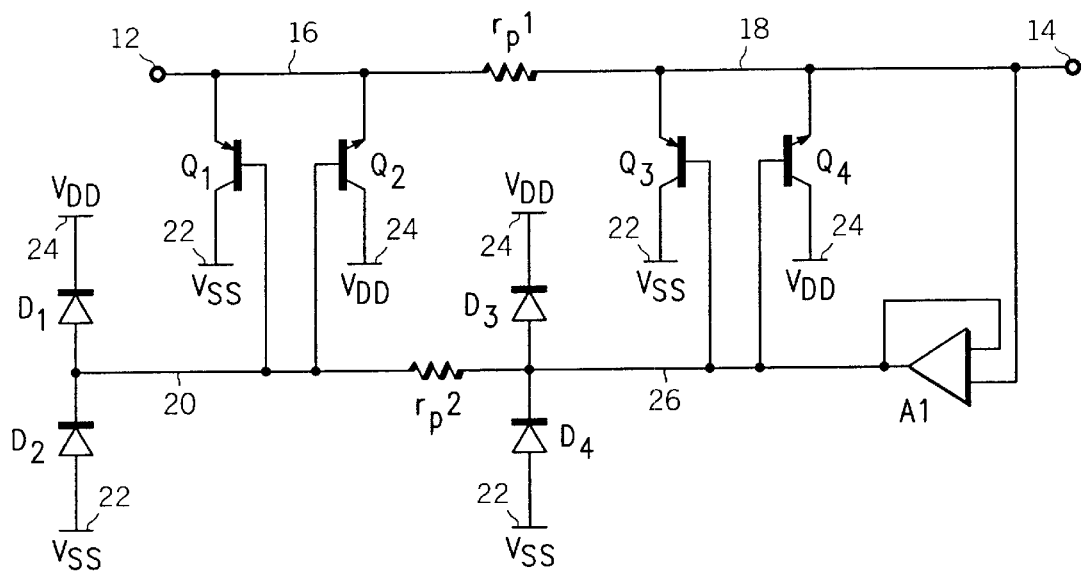
FIG. 1 is a circuit schematic diagram of the ESD protection circuit of the present invention.

Turning to FIG. 1, there is shown ESD protection circuit 10 of the present invention. ESD protection circuit 10 may be incorporated as part of a conventional integrated circuit (IC) that also includes an analog signal processor as part thereof. ESD protection circuit 10 is shown coupled to input pad 12, which may also be an input of the IC. Pad 12 is coupled to core output 14 of circuit 10 via metal conductive element 16, polyresistor rp1 and metal conductive element 18. Core output 14 generally would be coupled to internal circuitry of the IC as understood. First and second ESD protection diodes Q1 and Q2 are provided as in a conventional ESD protection circuit. Q1 comprises a PNP transistor having its emitter electrode coupled to input 12, its base electrode coupled to metal conductive element 20, and its collector electrode coupled to ground rail 22 to which is supplied $V_{SS}$. Similarly, Q2 comprises an NPN transistor having its emitter electrode coupled to metal conductive element 16 and its base electrode coupled to metal conductive element 20. The collector electrode of Q2 is coupled to positive rail 24 to which is supplied $V_{DD}$. The base electrodes of Q1 and Q2 are coupled to interconnection of the anode and cathode of diodes D1 and D2 respectively. The cathode of D1 is returned to positive rail 24 while the anode of D2 is coupled to negative or ground rail 22.

In operation, as an ESD voltage at input 12 exceeds $V_{DD}$, the base-emitter junction of Q1 is forward biased and current flows through Q1 via D1 to the positive rail 24. Likewise, a positive ESD voltage appearing at rail 22 will cause current flow via D2 and the base-emitter of Q2 to input pad 12 once the base-emitter junction is forward biased thereby. Hence, both input 12 and output 14 are substantially clamped to either the positive or negative power rail voltages depending on the polarity of the ESD occurrence.

Similarly, core output 14 is clamped to the positive and negative rails responsive to positive and negative ESD voltages that may occur on metal conductive elements 18 and 26 respectively as the base-emitter junctions of Q3 and Q4 are forward biased. Thus, a positive ESD voltage appearing on metal conductive element 18 causes a current flow via Q3 and D3 to rail 24 while negative ESD spike voltages produce current flow from negative rail 22 via D4 and Q4 to metal conductive element 18.

ESD protection circuit 10 includes unity gain amplifier A1 having an input coupled to output 14 while its output is coupled to conductive elements 26 and 20. A second poly-resistor rp2 is coupled between metal conductive elements 20 and 26. Typically, the resistances of rp1 and rp2 are small (150 ohms or less).

The effect of metal conductive elements 16–26, resistors rp1, rp2, and the relatively large base-emitter junctions of Q1–Q4 is to generally increase the parasitic capacitance seen between metal conductive elements 16,18 and 20,26 due to the structure of the integrated circuit as will be discussed later in more detail. This increased capacitance is undesirable as it can prevent detection of small voltages applied to input 12. However, unity gain amplifier A1 of the present invention minimizes this unwanted parasitic capacitance by maintaining a zero voltage difference between the metal conductive elements as will be further explained.

Figure 2:
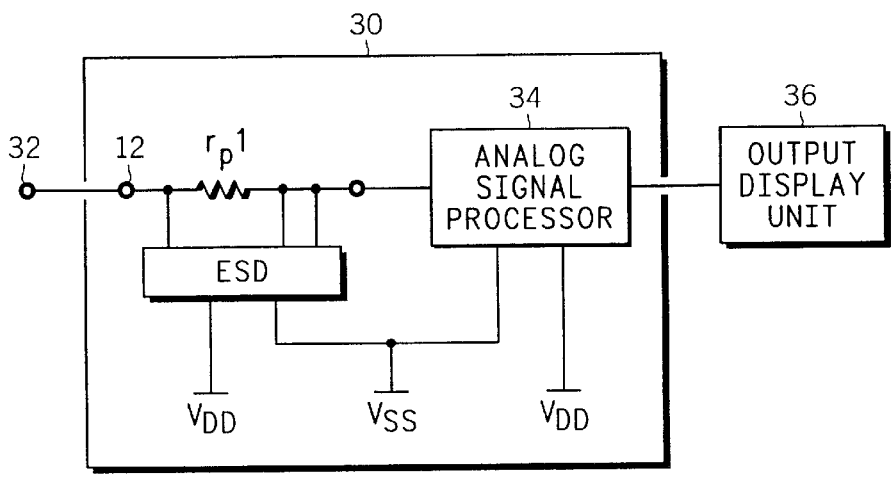
FIG. 2 is a simple illustration of an integrated circuit utilizing the ESD protection circuit of FIG. 1.

Referring to FIG. 2, integrated circuit 30 is shown in simplified form. IC incorporates ESD protection circuit 10 of the present invention. Integrated circuit 30 includes at least one input 32 coupled to the input 12 of circuit 10 the output 14 of which may be coupled via rp1 to an analog signal processor shown at 34. A probe, for example, may be attached at input 32 to detect small voltage differences (such as from a pressure sensor). The voltage differences are processed by signal processor 34 to provide desired information that is the displayed by output display unit 36.

Turning now to FIG. 3 there is shown a simplified, partial cross sectional view of monolithic integrated circuit (IC) 40 useful for describing the structure of diode-connected transistors Q1 and Q2 of FIG. 1. IC 40 is conventional in structure and includes P-type substrate 42. Isolated N-well 44 is constructed by providing a layer of N-type epitaxial semiconductor material on substrate 42 and diffusing isolation ring 46 through the N-type layer into P substrate 42. Q1 is then constructed by diffusing P-type base regions 48 and 50, as well as N-type emitter region 52 into isolated N-well 44. The P+-type collector region 54 of Q1 may be formed in isolation ring 46. Similarly, using known and conventional photolithographic techniques, isolated P-well 56 is constructed by providing a P-type layer of semiconductor material on P substrate 42. Next, a buried layer 58 of N-type semiconductor material is formed into both P substrate 42 and the P-well. Isolated P-well 56 is completed by diffusing N-type isolation ring 60 through the P-type layer into buried layer 58. Q2 is formed by diffusing base regions 62 and 64, as well as emitter region 66, into isolated P-well 56. Metal conductive elements 16 and 18 (FIG. 1) are formed by selectively patterning metalization layers 68 and 70, the latter of which makes contact to output 14. Poly-resistor rp1 is grown and contacts layers 68 and 70. Similarly, base regions 50 and 62 of Q1 and Q2 are connected by metalization layer 72. It is understood that Q3 and Q4, as well as rp2, are likewise constructed as aforementioned.

As described above, the selective patterned metalization layers as well as the two poly-resistors, which overlay the isolated wells, form one plate of a capacitor at input 12. Isolated wells 44 and 56 create the second plate of the aforementioned capacitor. However, since amplifier A1 provides unity gain feedback across the two plates of the capacitor, a zero voltage is maintained thereacross. Thus, the effective capacitance is substantially zero.

Referring now to FIG. 4 there is described additional ESD protection circuit 80. Circuit 80 functions similar to circuit 10 described above utilizing NMOS transistors instead of bipolar transistors. Circuit 80 includes input 82 which may also be an input/output pad of a monolithic integrated circuit. Input 82 is coupled via resistor r1 (a poly-resistor, for example) to output 84. Output 84 is coupled to internal IC circuitry (not shown) as already described above. A n-channel MOSFET device Q1 is coupled between input 82 and common terminal 86 via its source and drain main electrodes while the gate control electrode thereof is connected to its source electrode. A second n-channel MOSFET device Q2 is coupled between common terminal 86 and terminal 88 to which ground reference is applied. Hence, the drain and source main electrodes of Q2 are connected to common terminal 86 and terminal 88 while the gate control electrode thereof is connected to its source electrode. Because Q1 and Q2 are formed in a P-type substrate, such as shown in FIG. 3, a parasitic P/N junction exists between the substrate and the drain electrodes thereof. Consequently, a high positive ESD voltage occurring at input 82 with respect to ground reference will produce current flow through Q1 and Q2. The high voltage causes Q2 to operate in a reverse breakdown or snap back mode, as understood, to thereby clamp the input to essentially the voltage developed across Q2 in the snap back mode of operation. Similarly, a high negative ESD voltage occurring at input 82 with respect to ground reference causes current flow from ground reference to input 82 via Q2 and Q1. Q1 will operate in a reverse breakdown or snap back mode to clamp input 82 thereat as previously described.

Common terminal 86 is shown coupled via resistor r2 (which may be a poly-resistor) to additional common terminal 90. A pair of NMOSFET devices Q3 and Q4, which have their respective main electrodes coupled in series to one another are shown serially coupled between output 84 and terminal 88. The gate electrodes of each of these two NMOSFET devices are connected to their respective source electrodes. Additional common terminal 90 also forms the interconnection between the drain electrodes of Q3 and Q4. Unity gain amplifier A1 has an input coupled to output 84 and an output coupled to additional common terminal 90 in the same way as illustrated in FIG. 1.

Q3 and Q4 function in a like manner as described previously with respect to Q1 and Q2 of protection circuit 90. Thus, output 84 will be clamped to the respective snap back voltages of either Q3 and Q4 responsive to ESD voltages exceeding the respective break down voltage of the two devices.

Hence, what has been described above is a novel and inventive ESD protection circuit for protecting internal integrated circuitry from ESD damage. The ESD protection circuit uses feedback to reduce or severely limit the parasitic capacitance formed at the input thereof due to the structure of the integrated circuit in which the protection circuit is formed. As an example, the ESD protection circuit may be incorporated with a signal processor integrated circuit for measuring small input voltages applied to the input of the integrated circuit. Various changes may be made in the function and arrangement described in connection with the exemplary embodiments without departing from the spirit and scope of the invention as set forth in the appended claims.

What is claimed is:

1. An electrostatic discharge (ESD) protection circuit for protecting circuitry internal to an integrated circuit, which is coupled to an output of the ESD protection circuit, from ESD damage due to ESD voltages occurring at the input thereof, comprising:

first and second power supply rails;

a first diode of first conductivity type coupled between the input of the integrated circuit and a first circuit node, said first diode providing a first current path to said first power supply rail when forward biased by an ESD voltage exceeding a predetermined positive value thereby clamping the input thereat;

a second diode of a second conductivity type coupled between the input of the integrated circuit and said first circuit node, said second diode providing a second current path to said second power supply rail to the input when forward biased by said ESD voltage exceeding a predetermined negative value thereby clamping the input thereat; and a feedback amplifier for maintaining a substantially zero voltage difference between the input and said first circuit node wherein any effective capacitance at the input is reduced to substantially zero.

2. The ESD protection circuit of claim 1 further comprising:

a third diode of said first conductivity type coupled between the output of the ESD protection circuit and a second circuit node; and a fourth diode of said second conductivity type coupled between the output of the ESD protection circuit and said second circuit node.

3. The ESD protection circuit of claim 2 further including:

a first resistor coupled between the input and output of the ESD protection circuit; and a second resistor coupled between said first and said second circuit nodes.

4. The ESD protection circuit of claim 3 further including:

a fifth diode having an anode and cathode, said anode coupled to said first circuit node of the ESD protection circuit, and said cathode coupled to said first power supply rail;

a sixth diode having an anode and cathode, said anode coupled to said second power supply rail and said cathode coupled to said first circuit node.

5. The ESD protection circuit of claim 4 further comprising:

a seventh diode having an anode and cathode, said anode coupled to said first circuit node of the ESD protection circuit, and said cathode coupled to said first power supply rail; and a eighth diode having an anode and cathode, said anode coupled to said second power supply rail and said cathode coupled to said first circuit node.

6. ESD protection circuit of claim 5 wherein said a seventh diode having an anode and cathode, said anode coupled to said first circuit node of the ESD protection circuit, and said cathode coupled to said first power supply rail;

eighth diode having an anode and cathode, said anode coupled to said second power supply rail and said cathode coupled to said first circuit node.

7. The ESD protection circuit of claim 2 wherein:

said first diode being realized by a first transistor having a base, emitter and collector, said base being coupled to said first circuit node and said emitter being coupled to the input of the ESD protection circuit while said collector is connected to said first power supply rail; and said second diode being realized by a second transistor having a base, emitter and collector, said base being coupled to said first circuit node and said emitter being coupled to the input of the ESD protection circuit while said collector is connected to said second power supply rail.

8. The ESD protection circuit of claim 7 including:

said third diode realized by a third transistor having a base, emitter and collector, said base being coupled to said second circuit node and said emitter being coupled to the output of the ESD protection circuit while said collector being connected to said first power supply rail; and said fourth diode realized by a fourth transistor having a base, emitter and collector, said base being coupled to said second circuit node and said emitter being coupled to the output of the ESD protection circuit while said collector is connected to said second power supply rail.

9. The ESD protection circuit of claim 8 further comprising said feedback amplifier being an unity gain amplifier.

10. The ESD protection circuit of claim 9 being formed internally to the monolithic integrated circuit, the monolithic integrated circuit comprising:

a substrate region of a first semiconductor material;

a first isolated region of a second semiconductor material formed on said substrate region; and a second isolated region of said first semiconductor material formed on said substrate region, said isolated regions of said first and second semiconductor regions being functionally isolated from one another.

11. The ESD protection circuit of claim 10 further comprising:

said base of said first transistor being formed by a region in said first isolated region and being of said second semiconductor material; and said emitter of said first transistor formed by a region in said first isolated region and being of said first semiconductor material.

12. The ESD protection circuit of claim 11 further comprising:

said base of said second transistor being formed by a region in said second isolated region and being of said first semiconductor material; and said emitter of said second transistor formed by a region in said second isolated region and being of said second semiconductor material.

13. The ESD protection circuit of claim 12 including:

a first layer of metalization formed over said first and second isolated regions and selectively patterned to connect said emitter regions of said first and second transistors to both the input of the ESD protection circuit and to one side of said first resistor;

an additional layer of metalization formed over said first and second isolated regions and selectively patterned to connect said base regions of said first and second transistors to one side of second resistor, said additional layer of metalization being said first circuit node; and said first and second isolated regions forming one plate of an input capacitor that effectively is coupled to the input of the ESD protection while said first and second selectively patterned metalization layers, said first and second resistors and said emitter regions of said first and second transistors form the other plate of the capacitor across which said feedback amplifier maintains a zero voltage difference.

14. An integrated circuit for detecting small voltages applied at an input thereof and processing such voltages in order to provide an output indicative thereof, comprising:

an ESD protection circuit for protecting the integrated circuit from damage due to electrostatic discharge voltages occurring at the input, said ESD protection including feedback to substantially reduce the effective input capacitance to zero; and an analog signal processor coupled to the input of the integrated circuit for providing the indicative signal at the output of the integrated circuit.

15. The integrated circuit according to claim 14 wherein said ESD protection circuit comprises:

a first diode of first conductivity type coupled between the input of the integrated circuit and a first circuit node, said first diode providing a first current path when forward biased by an ESD voltage exceeding a predetermined positive value;

a second diode of a second conductivity type coupled between the input of the integrated circuit and said first circuit node, said second diode providing a second current path when forward biased by said ESD voltage exceeding a predetermined negative value; and a feedback amplifier for said feedback to maintain a substantially zero voltage difference between the input and said first circuit node wherein any effective capacitance at the input is reduced to substantially zero.

16. The ESD protection circuit of claim 15 further comprising:

a third diode of said first conductivity type coupled between an output of the ESD protection circuit and a second circuit node; and a fourth diode of said second conductivity type coupled between said output of the ESD protection circuit and said second circuit node.

17. The ESD protection circuit of claim 16 further including:

a first resistor coupled between the input and output of the ESD protection circuit; and a second resistor coupled between said first and said second circuit nodes.

18. The ESD protection circuit of claim 17 further including:

a fifth diode having an anode and cathode, said anode coupled to said first circuit node of the ESD protection circuit, and said cathode coupled to a first terminal for receiving a first operating potential;

a sixth diode having an anode and cathode, said anode coupled to a second terminal for receiving a second operating potential and said cathode coupled to said first circuit node.

19. The ESD protection circuit of claim 18 further comprising:

a seventh diode having an anode and cathode, said anode coupled to said first circuit node of the ESD protection circuit, and said cathode coupled to said first terminal;

a eighth diode having an anode and cathode, said anode coupled to said second terminal and said cathode coupled to said first circuit node.

20. The ESD protection circuit of claim 19 wherein said feedback amplifier is an unity gain amplifier.

21. The ESD protection circuit of claim 16 wherein:

said first diode being realized by a first transistor having a base, emitter and collector, said base being coupled to said first circuit node and said emitter being coupled to the input of the ESD protection circuit while said collector is connected to said first terminal; and said second diode being realized by a second transistor having a base, emitter and collector, said base being coupled to said first circuit node and said emitter being coupled to the input of the ESD protection circuit while said collector is connected to said second terminal.

22. The ESD protection circuit of claim 21 including:

said third diode realized by a third transistor having a base, emitter and collector, said base being coupled to said second circuit node and said emitter being coupled to the output of the ESD protection circuit while said collector being connected to said first terminal; and said fourth diode realized by a fourth transistor having a base, emitter and collector, said base being coupled to said second circuit node and said emitter being coupled to the output of the ESD protection circuit while said collector is connected to said second terminal.

23. The ESD protection circuit of claim 22 further comprising said feedback amplifier being an unity gain amplifier.

24. An electrostatic discharge (ESD) protection circuit for protecting circuitry internal to an integrated circuit (IC) that is coupled to an output of the ESD protection circuit from ESD damage, the ESD protection circuit having an input coupled to an input of the IC, comprising:

a circuit responsive to ESD voltages occurring at the input of the IC exceeding predetermined positive and negative voltage levels for clamping the input of the IC to predetermined voltage levels to prevent damage to the IC, said circuit having a common terminal; and a feedback amplifier coupled from said output of the ESD protection circuit and said common terminal for maintaining a substantially zero voltage difference between the input and said common terminal wherein any effective capacitance at the input is reduced to substantially zero.

25. The ESD protection circuit of claim 24 wherein said circuit includes:

a first diode of first conductivity type coupled between the input of the integrated circuit and said common terminal, said first diode providing a first current path to said common terminal when forward biased by an ESD voltage exceeding a predetermined positive value; and a second diode of a second conductivity type coupled between the input of the integrated circuit and said common terminal, said second diode providing a second current path to the input of the integrated circuit from said common terminal when forward biased by said ESD voltage exceeding a predetermined negative value.

26. The ESD protection circuit of claim 25 wherein said circuit further includes:

a third diode of said first conductivity type coupled between the output of the ESD protection circuit and an additional common terminal; and a fourth diode of said second conductivity type coupled between the output of the ESD protection circuit and said additional common terminal.

27. The ESD protection circuit of claim 26 wherein said circuit further includes:

a first resistor coupled between input and output of the ESD protection circuit; and a second resistor coupled between said common terminal and said additional common terminal.

28. The ESD protection circuit of claim 27 wherein said circuit further comprises:

a fifth diode having an anode and cathode, said anode coupled to said common terminal, and said cathode coupled to a first power supply rail;

a sixth diode having an anode and cathode, said anode coupled to a second power supply rail and said cathode coupled to said common terminal.

29. The ESD protection circuit of claim 28 wherein said circuit further comprising:

a seventh diode having an anode and cathode, said anode coupled to said additional common terminal, and said cathode coupled to said first power supply rail;

an eighth diode having an anode and cathode, said anode coupled to said second power supply rail and said cathode coupled to said additional common terminal.

30. The ESD protection circuit of claim 29 wherein said feedback amplifier is an unity gain amplifier.

31. The ESD protection circuit of claim 25 wherein;

said first diode being realized by a first transistor having a base, emitter and collector, said base being coupled to said common terminal and said emitter being coupled to the input of the ESD protection circuit while said collector is connected to said first power supply rail; and said second diode being realized by a second transistor having a base, emitter and collector, said base being coupled to said common terminal and said emitter being coupled to the input of the ESD protection circuit while said collector is connected to said second power supply rail.

32. The ESD protection circuit of claim 31 including:

said third diode realized by a third transistor having a base, emitter and collector, said base being coupled to said additional common terminal and said emitter being coupled to the output of the ESD protection circuit while said collector being connected to said first power supply rail; and said fourth diode realized by a fourth transistor having a base, emitter and collector, said base being coupled to said additional common terminal and said emitter being coupled to the output of the ESD protection circuit while said collector is connected to said second power supply rail.

33. The ESD protection circuit of claim 32 wherein said feedback amplifier comprises an unity gain amplifier.

34. The ESD protection circuit of claim 33 being formed internally to the monolithic integrated circuit, the monolithic integrated circuit comprising:

a substrate region of a first semiconductor material;

a first isolated region of a second semiconductor material formed on said substrate region; and a second isolated region of said first semiconductor material formed on said substrate region, said isolated regions of said first and second semiconductor regions being functionally isolated from one another.

35. The ESD protection circuit of claim 34 further comprising:

said base of said first transistor being formed by a region in said first isolated region and being of said second semiconductor material; and said emitter of said first transistor formed by a region in said first isolated region and being of said first semiconductor material.

36. The ESD protection circuit of claim 35 further comprising:

said base of said second transistor being formed by a region in said second isolated region and being of said first semiconductor material; and said emitter of said second transistor formed by a region in said second isolated region and being of said second semiconductor material.

37. The ESD protection circuit of claim 36 further comprising:

a first layer of metalization formed over said first and second isolated regions and selectively patterned to connect said emitter regions of said first and second transistors to both the input of the ESD protection circuit and to one side of said first resistor;

an additional layer of metalization formed over said first and second isolated regions and selectively patterned to connect said base regions of said first and second transistors to one side of second resistor, said additional layer of metalization being said first circuit node; and said first and second isolated regions forming one plate of an input capacitor that effectively is coupled to the input of the ESD protection while said first and second selectively patterned metalization layers, said first and second resistors and said emitter regions of said first and second transistors form the other plate of the capacitor across which said feedback amplifier maintains a zero voltage difference.

38. The ESD protection circuit of claim 24 wherein said circuit comprises:

a first resistor coupled between the input and output of the ESD protection circuit;

a first MOS transistor having first and second main electrodes coupled respectively to the input and said common terminal, and a control electrode connected to said first main electrode; and a second MOS transistor having first and second main electrodes coupled respectively between said common terminal and a power supply rail, and a control electrode connected to said first main electrode.

39. The ESD protection circuit of claim 38 further comprising:

said circuit having an additional common terminal;

a third MOS transistor having first and second main electrodes coupled between the output of the ESD protection circuit and said additional common terminal respectively, and a control electrode connected to said first main electrode; and a fourth MOS transistor having first and second main electrodes coupled respectively between said additional common terminal and said power supply rail, and a control electrode connected to said first main electrode.

40. The ESD protection circuit of claim 39 including a second resistor coupled between said common terminal and said additional common terminal.

41. The ESD protection circuit of claim 40 wherein said feedback amplifier being an unity gain amplifier having an input coupled to said output of the ESD protection circuit and an output coupled to said second resistor at said additional common terminal.

* * * * *